(12) United States Patent
Chou

(10) Patent No.: US 7,126,869 B1
(45) Date of Patent: Oct. 24, 2006

(54) SENSE AMPLIFIER WITH DUAL CASCODE TRANSISTORS AND IMPROVED NOISE MARGIN

(75) Inventor: Richard K. Chou, Palo Alto, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 156 days.

(21) Appl. No.: 10/875,889

(22) Filed: Jun. 24, 2004

Related U.S. Application Data

(60) Provisional application No. 60/482,634, filed on Jun. 26, 2003.

(51) Int. Cl.
*G11C 7/02* (2006.01)
*G11C 7/00* (2006.01)

(52) U.S. Cl. ..................... 365/207; 365/203

(58) Field of Classification Search ............. 365/207, 365/203, 205; 327/51
See application file for complete search history.

(56) References Cited

U.S. PATENT DOCUMENTS

| | | | |
|---|---|---|---|
| 4,851,720 A | 7/1989 | Pathak et al. | |
| 4,935,649 A | 6/1990 | Bloker | |
| 5,410,268 A * | 4/1995 | Sharpe-Geisler | 327/51 |
| 5,504,443 A | 4/1996 | Gross et al. | |
| 5,525,919 A | 6/1996 | Phelan | |
| 5,565,791 A | 10/1996 | Raza | |
| 5,572,474 A * | 11/1996 | Sheen et al. | 365/207 |
| 5,619,149 A * | 4/1997 | Lev et al. | 327/51 |
| 5,638,322 A | 6/1997 | Lacey | |
| 5,640,356 A | 6/1997 | Gibbs | |
| 5,666,310 A | 9/1997 | Yu et al. | |
| 5,737,612 A | 4/1998 | Ansel et al. | |
| 5,748,015 A * | 5/1998 | Tam | 327/51 |
| 5,748,021 A | 5/1998 | Hunt et al. | |
| 6,087,858 A | 7/2000 | Hunt et al. | |
| 6,137,741 A * | 10/2000 | Liu | 365/208 |
| 6,181,615 B1 | 1/2001 | Chhor | |
| 6,359,808 B1 * | 3/2002 | Chen et al. | 365/185.21 |
| 6,501,696 B1 | 12/2002 | Mnich et al. | |
| 6,707,741 B1 | 3/2004 | Mnich et al. | |
| 2004/0252568 A1* | 12/2004 | La Rosa | 365/207 |

* cited by examiner

*Primary Examiner*—Anh Phung
(74) *Attorney, Agent, or Firm*—Kevin L. Daffer; Daffer McDaniel, LLP

(57) ABSTRACT

A sense amplifier, system and methods for increasing a noise margin of the sense amplifier are contemplated herein. In general, the sense amplifier includes a pair of cascode transistors coupled in parallel between a power supply node and a sense line of the sense amplifier. The sense amplifier also includes a precharge node coupled to the power supply node through a first precharge transistor, and a sense node coupled to the power supply node through a second precharge transistor. The sense amplifier described herein functions to separate the sense node from the precharge node with the pair of cascode transistors, which in turn, increases the noise margin of the sense amplifier by decoupling the sense node from any voltage fluctuations that may be present on the sense line during a sensing state.

21 Claims, 3 Drawing Sheets

SENSE AMPLIFIER WITH DUAL CASCODE TRANSISTORS AND IMPROVED NOISE MARGIN

PRIORITY APPLICATION

This application claims priority to a provisional application Ser. No. 60/482,634 entitled "Sense Amplifier with Dual Cascode Transistors and Method of Using the Same," filed Jun. 26, 2003 and incorporated herein in its entirety.

BACKGROUND OF THE INVENTION

1. Field of the Invention

This invention relates to sense circuitry and, more particularly, to a sense amplifier having separate cascode devices for precharge and sensing portions of the sense amplifier.

2. Description of the Related Art

The following descriptions and examples are given as background only.

The proliferation of computers and other microprocessor-based devices has contributed to an increasing demand for semiconductor memory. Microprocessors are present not only in computers, but in a diverse range of products including automobiles, cellular telephones and kitchen appliances. A conventional microprocessor executes a sequence of instructions and processes information. Frequently, both the instructions and the information reside in semiconductor memory. Therefore, an increased requirement for memory has accompanied the microprocessor boom. As microprocessors have become more sophisticated, greater capacity and speed are demanded from the associated memory.

There are various types of semiconductor memory, including Read Only Memory (ROM) and Random Access Memory (RAM). ROM is typically used where instructions or data must not be modified, while RAM is used to store instructions or data which must not only be read, but modified. ROM is a form of non-volatile storage—i.e., the information stored in ROM persists even after power is removed from the memory. On the other hand, RAM storage is generally volatile, and must remain powered-up in order to preserve its contents.

A conventional semiconductor memory device stores information digitally, in the form of bits (i.e., binary digits). The memory is typically organized as a matrix of memory cells, each of which is capable of storing one bit. The cells of the memory matrix are accessed by word lines and bit lines. Word lines are typically associated with the rows of the memory matrix, while bit lines are associated with the columns. Raising a word line activates a given row; the bit lines are then used to read from (or write to) the corresponding cells in the currently active row. Memory cells are typically capable of assuming one of two voltage states (commonly described as "on" or "off"). Information is stored in the memory by setting each cell in the appropriate logic state. For example, to store a bit having the value 1 in a particular cell, one would set the state of that cell to "on;" similarly, a 0 would be stored by setting the cell to the off state. (Obviously, the association of "on" with 1 and "off" with 0 is arbitrary, and could be reversed.)

The contents of a memory cell are generally read by applying an input voltage to a selected wordline, and sensing whether the voltage on a selected bitline changes in response to the applied input voltage. In some cases, the bitline acts as a capacitor, and may be precharged to a predetermined voltage before the memory cell is read. When the memory cell is read, the bitline voltage may discharge to ground to indicate a first logic state, or may remain at the precharged voltage to indicate a second logic state. A sense amplifier is generally used to "sense" the logic state present on the selected bitline.

In some cases, a sense amplifier may be included for each column of memory cells in a memory array. The sense amplifiers may be single-ended or differential, depending on the particular configuration of the memory cell. For example, single-ended sense amplifiers may receive only one bitline as input, whereas differential sense amplifiers receive differential bitlines (i.e., a pair of complementary bitlines) as input. Single-ended sense amplifiers and memory cells are generally used to obtain smaller layouts than their differential counterparts, but often do so at the cost of reduced noise margins and operational speed. Though differential sense amplifiers and memory cells provide a somewhat larger layout, they are generally used in high-speed applications that benefit from relatively high common mode noise rejection.

Operational speed is often a primary concern in sense amplifier design. In some cases, the speed of the sense amplifier may be determined by the sensitivity of the sense amplifier to the discharge rate of the bitline. For example, a relatively sensitive sense amplifier may have a relatively high trip-point voltage (i.e., a voltage relatively close to the precharge voltage), which enables the sense amplifier to detect a programmed memory location once the voltage level on the bitline drops by a small amount. On the other hand, a sense amplifier with relatively low sensitivity may have a substantially lower trip-point voltage, which requires a much larger voltage drop on the bitline before a programmed memory location can be detected. Since it generally takes longer to discharge the bitline to a lower trip-point voltage (and to precharge the bitline to the precharge voltage when the bitline is discharged to a lower voltage), a more sensitive sense amplifier may be desired when operational speed is a concern.

Another consideration in sense amplifier design is power consumption. The act of charging and discharging the bitline generally results in power consumption; the greater the swing between precharged and discharged voltage values, the greater the power consumption. Low memory device power consumption is crucial in many devices, including portable computing and telecommunication devices (e.g., portable computers, personal digital assistants, cell phones, etc.). Therefore, the level to which the bitline is precharged is often limited, in some memory devices, to decrease the power consumption by reducing the swing between the precharged and discharged bitline voltage values.

For example, a cascode device may be coupled between the bitline of a memory cell and the output stage of a conventional single-ended sense amplifier. In some cases, a "cascode device" may be defined as a transistor, which is turned "on" and "off" by varying the voltage applied to the source terminal of the transistor, rather than varying the gate voltage. For example, an N-channel cascode transistor may have a source terminal coupled to a bitline, a drain terminal coupled to an input node of the sense amplifier output stage, and a gate terminal coupled to a constant voltage source (e.g., $V_{CC}$). A pull-up device (or "precharge transistor") may be coupled to the drain terminal of the cascode transistor for precharging the bitline to a voltage value approximately equal to the value of the constant voltage source minus the threshold voltage (or turn-on voltage) of the cascode transistor. The input of the output stage may also be precharged to $V_{CC}$. To reduce the precharge voltage swing, the constant voltage source may be some intermediate voltage between ground and $V_{CC}$. If the selected memory cell is programmed, a drop in the bitline voltage during a read cycle will cause the cascode transistor to switch on, thereby coupling the bitline to the input of the output stage. The voltage at the input of the output stage drops rapidly to the voltage of the bitline through charge sharing.

Unfortunately, a problem with the conventional sense amplifier described above arises when noise on the bitline causes the cascode transistor to inadvertently switch on, resulting in the reading of invalid data. Potential noise sources may include, e.g., capacitive coupling between nearby bitlines in the same layer and/or within adjacent layers of the memory cell. Therefore, a noise margin must be provided to account for noise that can be injected on the bitline. Providing a sufficient noise margin increases the reliability of the data read from the memory cell.

SUMMARY OF THE INVENTION

The problems outlined above are in large part solved by an improved sense amplifier including a precharge node coupled to a power supply node through a first precharge transistor, a sense node coupled to the power supply node through a second precharge transistor, and a pair of cascode transistors coupled in parallel between the power supply node and a sense line. In this manner, at least one of the pair of cascode transistors may be configured for separating the sense node from the precharge node. Thus, the sense node may be substantially unaffected by voltage perturbations that may occur on the sense line (e.g., a bit line) of the sense amplifier. As a consequence, a trip-point of the sense amplifier may be increased, in some embodiments, to increase the operating speed of the sense amplifier, while maintaining acceptable noise margin.

In a particular embodiment, the sense node may be separated from the precharge node by coupling the precharge node between the first precharge transistor and a first cascode transistor, while the sense node is coupled between the second precharge transistor and a second cascode transistor, of the pair of cascode transistors. In some cases, the first cascode transistor may have a lower turn-on voltage threshold than the second cascode transistor. For example, a channel region of the first cascode transistor may be doped with a substantially higher dopant concentration than a channel region of the second cascode transistor to provide the first cascode transistor with a lower turn-on voltage. In some cases, the first cascode transistor may have a higher conductance than the second cascode transistor. For example, a width-to-length ratio of the first cascode transistor may be greater the width-to-length ratio of the second cascode transistor to provide the first cascode transistor with a higher conductance. In general, the turn-on voltage thresholds and/or the conductance of the cascode transistors can be independently adjusted to obtain a desirable balance between noise margin and operating speed.

In addition to the aspects described above, the sense amplifier may further include an output path extending between the sense node and an output node of the sense amplifier. The output path may include the sense node and a pair of inverters, but does not include the precharge node. By removing the precharge node from the output path, the sense node (and thus, the output node) may be substantially unaffected by the voltage perturbations that may occur on the sense line and affect the precharge node.

A system including such a sense amplifier may also be contemplated herein. In some cases, the system may include an array of memory cells. In such a case, the sense line of the sense amplifier may be coupled for receiving a bitline voltage from one of the memory cells in the array. In other cases, the system may include a storage element, and the sense line may be coupled for receiving a voltage value corresponding to data to be stored within the storage element. The storage element may comprise substantially any storage element known in the art including, but not limited to, memory cells, registers, latches, etc.

In another embodiment, a method for increasing a noise margin of a sense amplifier including a pair of cascode transistors coupled in parallel between a power supply node and a sense line. Each of the pair of cascode transistors may comprise an independently selected turn-on voltage threshold and/or conductance. In general, the method may include precharging the sense line up to a voltage value of the power supply node minus a lesser voltage of the turn-on voltage thresholds of the pair of cascode transistors. In this manner, the step of precharging may increase the noise margin of the sense amplifier by prohibiting at least one of the pair of cascode transistors to be activated during a sensing state of the sense amplifier.

The method may also include precharging a precharge node and a sense node of the sense amplifier to approximate a voltage value at the power supply node. As noted above, the precharge node may be coupled between the power supply node and a first cascode transistor, whereas the sense node may be coupled between the power supply node and a second cascode transistor of the pair of cascode transistors. In order to increase the noise margin of the sense amplifier, the "lesser voltage" described above may correspond to the turn-on voltage of the first cascode transistor. In other words, the second cascode transistor may have a greater turn-on voltage than the first cascode transistor, so that the second cascode transistor is not activated during the sensing state.

In another embodiment, the method may include isolating a sense node of the sense amplifier from a precharge node of the sense amplifier by removing the precharge node from an output path of the sense amplifier. In this manner, a noise margin of the sense amplifier may be substantially increased by eliminating a sensitivity of the sense node to voltage fluctuations that may be present on the sense line when the sense amplifier is in a sensing state. In some cases, the step of isolating may include providing a pair of cascode transistors coupled in parallel between a power supply node and a sense line. As mentioned above, the precharge and sense nodes may be coupled to the sense line through the first cascode transistor and the second cascode transistor, respectively. In this method, the turn-on voltage thresholds and/or the conductances of the cascode transistors can be independently adjusted to obtain a desirable balance between noise margin and operating speed.

BRIEF DESCRIPTION OF THE DRAWINGS

Other objects and advantages of the invention will become apparent upon reading the following detailed description and upon reference to the accompanying drawings in which.

Figure 1:
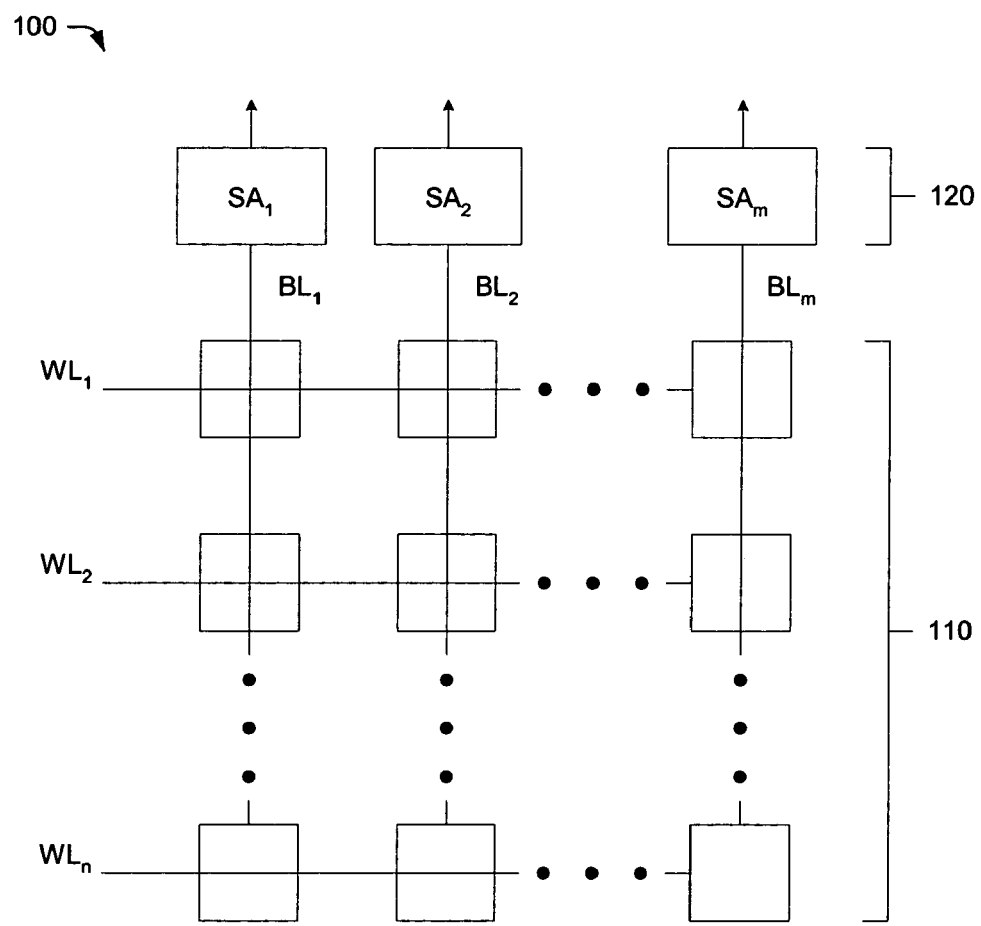
FIG. 1 is a block diagram illustrating one embodiment of a semiconductor memory device including an array of memory cells and a plurality of sense amplifiers.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIG. 1 shows one embodiment of a semiconductor memory device 100, including an array of memory cells and a plurality of sense amplifier circuits. FIG. 1 is not intended to illustrate all details of a semiconductor memory device, and instead, reduces the complexity of the memory device by showing only those components that are useful for understanding how a sense amplifier may be used, in one aspect of the invention.

As shown in FIG. 1, semiconductor memory device 100 may include an array of volatile or non-volatile memory cells 110. Examples of volatile memory cells include Static Random Access Memory (SRAM) cells and Dynamic Random Access Memory (SRAM) cells, whereas examples of non-volatile memory cells may include Read Only Memory (ROM) cells, Electrically Programmable Read Only Memory (EPROM) cells, Electrically Erasable and Programmable Read Only Memory (EEPROM) cells, and Flash cells. Regardless of the type of memory cell used, the memory cells may be arranged in a matrix (or an array) of rows and columns. In this manner, each memory cell in the array can be addressed by selecting a particular wordline (WL) and a particular bitline (BL).

Individual rows of memory array 110 may be selected by supplying an address to a bank of row decoders (not shown). By using a unique address, a particular row decoder may select one row in the memory array from which to read, write, or perform some other desired function. Once a row of memory cells is selected, a particular memory cell may be selected by placing a high voltage on the appropriate word line. The remaining memory cells may be deselected by placing a low voltage on the unselected word lines.

The contents of the selected memory cell may be read (or "sensed") by a sense amplifier coupled to the selected bitline line. In most cases, one sense amplifier may be included for each bitline of the memory array. In other words, "m" number of sense amplifiers 120 (denoted $SA_1, \ldots SA_m$) may be needed for detecting the logic state of the data stored within the memory array 110 of FIG. 1. Once the logic state of a particular memory cell is detected by the sense amplifier, it may be output from the semiconductor memory device for use within an external processing device (not shown).

Though a sense amplifier is described herein as included within a semiconductor memory device, the various aspects of the invention should not be limited to such an application, but instead, should be considered equally applicable to any semiconductor device that may benefit from the use of a sense amplifier. For example, the aspects of the invention may be applied to a sense amplifier included within, or coupled to, a system containing one or more storage elements, such as found within a register file (of a processor) or a flip-flop (of substantially any electronic circuit). Other applications will be apparent to those skilled in the art.

Figure 2:
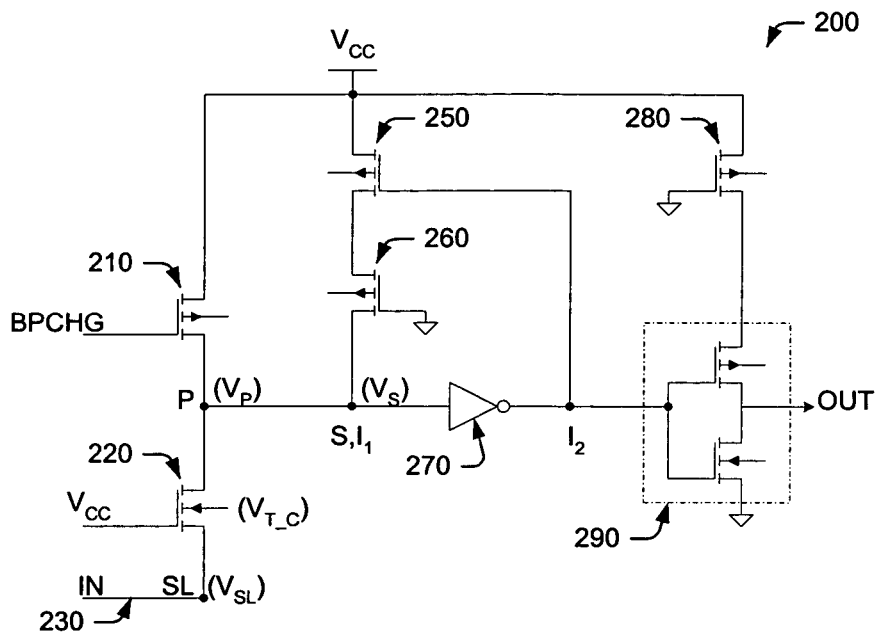
FIG. 2 is a circuit diagram illustrating one embodiment of a sense amplifier having only one cascode transistor.

FIG. 2 illustrates one embodiment of a sense amplifier 200 including a single cascode device 220 in series with a precharge path and a sense path. As shown in FIG. 2, the precharge path includes a PMOS precharge transistor 210 coupled in series between a power supply node ($V_{CC}$) and a precharge node (P). The NMOS cascode transistor 220 is included within the sense path, coupled between the precharge node (P) and a sense line 230. The term "sense line" may be otherwise referred to as a "match line" or an input conductor (IN) coupled to the sense amplifier. In some embodiments, for example, sense line 230 may be a bit line for connecting to one or more memory cells in a memory array.

As shown in FIG. 2, sense amplifier 200 also includes an output path and a feedback path. The output path is coupled in parallel to the precharge path and may include all, or some, of the sense path. As such, the output path may extend between the sense line input node (SL) and an output node (OUT) of the sense amplifier. The output path generally includes a pair of buffers, such as inverters 270 and 290. The feedback path, on the other hand, is coupled in parallel to the output path and extends between the power supply node ($V_{CC}$) and an input node ($I_1$) of first inverter 270. The feedback path generally includes a pair of serially connected PMOS feedback transistors 250 and 260. In some cases, the gate terminal of feedback transistor 250 may be coupled to an input node ($I_2$) of second inverter 290, whereas the drain terminal of feedback transistor 260 may be coupled to the input node ($I_1$) of first inverter 270.

Generally speaking, the input node ($I_1$) of first inverter 270 is coupled to receive (or sense) voltages from the precharge and feedback paths when sense amplifier 200 is in a "precharge state," and to receive voltages from the sense and feedback paths when in a "sensing state." As such, the first inverter input node ($I_1$) may also be referred to as a "sense node" (S). If the voltages received at the input node of the first inverter constitute a relatively high value, for example, a relatively low value may be output from first inverter 270 (and vice versa) to the second inverter input node ($I_2$). As used herein, a "relatively high value" may be described as a value that is significantly closer to the power supply voltage ($V_{CC}$) than a ground potential (gnd). The opposite may be true for a "relatively low value." For the sake of brevity, the terms "HIGH" and "LOW" may be used herein to refer to a "relatively high value" and a "relatively low value," respectively.

As shown in FIG. 2, second inverter 290 is also coupled to the power supply node ($V_{CC}$) through PMOS transistor 280. Since a gate terminal of PMOS transistor 280 is coupled to ground (and thus, is always "on"), second inverter 290 may be configured for outputting a HIGH value to the output node (OUT) of the sense amplifier upon receiving a LOW value from first inverter 270. The opposite would be true if second inverter 290 were to receive a HIGH value from first inverter 270.

The operating sequence of sense amplifier 200 may now be described in reference to FIGS. 2 and 4. In graph 400 of FIG. 4, the voltages present at the sense line input node (SL), the precharge node (P), and the sense node (S) of sense amplifier 200 are tracked during the precharge and sensing states. For example, a LOW value (i.e., a value at or very near the ground potential) may be supplied to the gate terminal (denoted BPCHG) of precharge transistor 210 to place sense amplifier 200 into the precharge state. Since precharge transistor 210 has a PMOS implementation, the LOW input value enables precharge transistor 210 to precharge or "pull up" the voltage value present at the S and P nodes to a value approximately equal to the power supply node voltage ($V_{CC}$). During the precharge state, sense line 230 may be precharged to a value approximately equal to the power supply node voltage ($V_{CC}$) minus a turn-on voltage threshold ($V_{T\_C}$) of cascode transistor 220. In other words, a precharge voltage value of the sense line input node (SL) may be approximately equal to ($V_{CC}-V_{T\_C}$). The sense and precharge nodes may each be precharged to approximately $V_{CC}$.

Once precharge is complete, a HIGH value may be supplied to the gate terminal of precharge transistor 210, thus disabling transistor 210 and initiating an evaluation of sense line 230 during a "sensing state" to detect a new voltage value at the sense node (S). In some cases, the new voltage value may differ from the precharge voltage value depending on the voltage level ($V_{SL}$) present on sense line 230. If the voltage level on sense line 230 remains HIGH, for example, the new voltage value may be substantially equal to the precharge voltage value on sense line 230 ($V_{CC}-V_{T\_C}$), and as a result, a HIGH value may be output from the output node (OUT) of sense amplifier 200. Otherwise, the sense node (S) may be discharged to ground (via some other circuit tied to the sense line) in the case of a LOW value on sense line 230, thereby causing a LOW value to be output from sense amplifier 200.

Unfortunately, sense amplifier 200 may be undesirable for several reasons. As shown in FIG. 2, for example, the precharge node (P), the sense node (S) and the first inverter input node ($I_1$) are substantially identical in both placement and voltage. For this reason, the voltage value ($V_P$) of the precharge node (P) tends to be very sensitive to the voltage value ($V_{SL}$) present on sense line 230 after precharge is completed and turned off. In other words, after precharge is complete, the difference between the sense line voltage value ($V_{SL}$) and the voltage supplied to the gate of cascode transistor 220 ($V_{CC}$) may be greater than or equal to the turn-on voltage threshold ($V_{T\_C}$) of cascode transistor 220. Since cascode transistor 220 will be in a conducting state, any slight voltage perturbation (e.g., leakage currents) on sense line 230, after the precharge is complete, will also cause the precharge node voltage value ($V_P$) to change. Since the precharge and sense nodes are essentially identical, the sense node voltage value ($V_S$) will also be affected by voltage perturbations on the sense line. Thus, it may be difficult to maintain a strong output voltage (e.g., a good HIGH level at the output node when $V_{SL}$ is HIGH), since leakage on the sense line tends to draw current to ground, thereby increasing the burden on transistor 250 (sometimes referred to as a "leakage" transistor) to maintain an adequate noise margin (NM). Though noise margins are generally dependent on process technology, an "adequate" noise margin may be defined herein as an acceptable range of voltages, which extend between the highest and lowest voltage levels that a logic gate recognizes as a certain logic value (e.g., a logic "1"), and fail to place the transistor in a conducting state when applied thereto.

Figure 4:
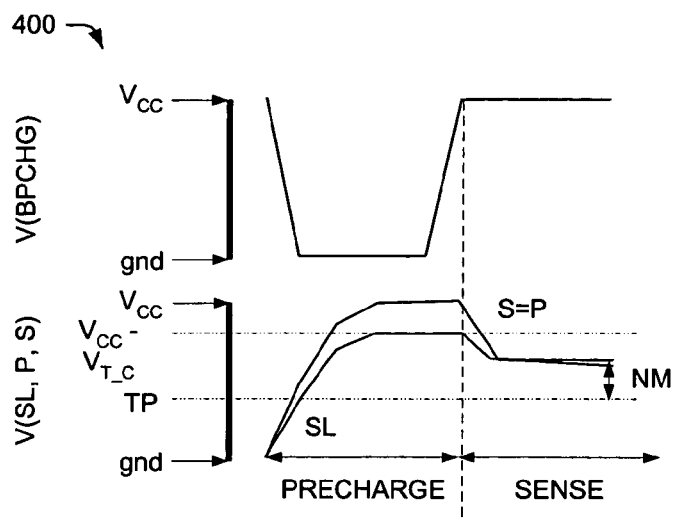
FIG. 4 is a graph of the sense line (SL), sense node (S) and precharge node (PC) voltages during precharge and sensing states of the sense amplifier of FIG. 2.

As shown in FIG. 4, the noise margin of a sense amplifier can be measured between the sense amp trip-point (which may depend heavily on the trip-point of first inverter 270) and the voltage value ($V_S$) present at the sense node. Because the sense node voltage is tied to the precharge node voltage in the embodiment of FIG. 2, any voltage perturbations on sense line 230 (illustrated in FIG. 4 as a voltage drop at the SL node during the sensing stage) will cause the sense node voltage value ($V_S$) to drop along with the precharge voltage value ($V_P$), thereby decreasing the noise margin of the sense amplifier and modifying the output voltage. For example, the reduced noise margin may cause transistor 220 to be inadvertently activated (when faced, e.g., with variations in supply voltage, process and temperature corners), thereby discharging the current from the sense node and causing the sense node voltage value to drop. In some cases, the trip-point (TP) of first inverter 270 may be lowered to maintain a strong output voltage and adequate noise margin. Unfortunately, lowering the trip-point of the first inverter lowers the sense amplifier trip-point, thereby decreasing the speed at which the sense amplifier operates.

Therefore, a need exists for an improved sense amplifier, and more specifically, a sense amplifier that demonstrates a significant increase in operating speed while maintaining, if not increasing, a noise margin associated with the sense amplifier. Though the improved sense amplifier may be applicable to a variety of technologies, it may be especially useful in circumstances requiring higher operating frequencies with reduced power supply voltages (e.g., microprocessors, graphics processors, network search engines, among others). The improved sense amplifier may also be useful in processes that suffer from increased sense line leakage. For example, leakage current on the sense line may present an even greater problem as transistor gate lengths fall below approximately 0.15 microns (μm). Leakage currents also tend to increase as transistors become smaller and faster. At gate lengths of about 0.09 μm, for example, leakage currents significantly increase between the source and drain, and may even become an issue at the gate node.

Figure 3:
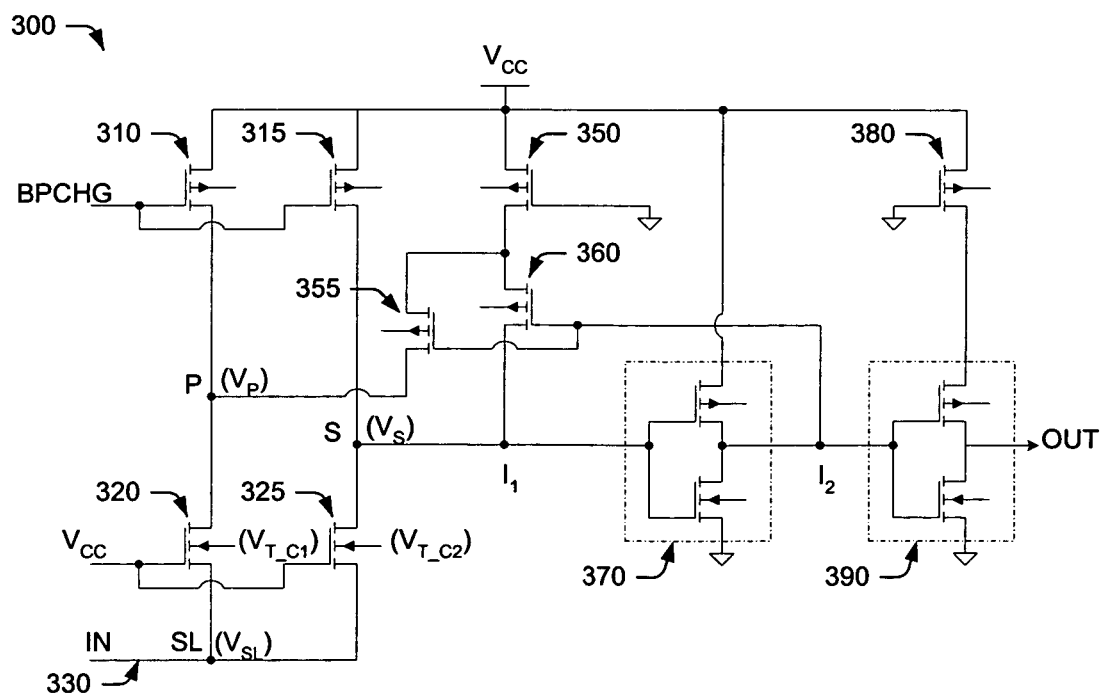
FIG. 3 is a circuit diagram illustrating a preferred embodiment of a sense amplifier having dual cascode transistors.

FIG. 3 illustrates an exemplary embodiment of another sense amplifier 300. In general, sense amplifier 300 may be considered a "dual cascode match sense amplifier." In other terms, sense amplifier 300 is a single-ended, reduced swing, precharged sense amplifier having separate NMOS cascode transistors 320 and 325 for precharging and sensing, respectively. As such, sense amplifier 300 generally differs from sense amplifier 200 by including an additional cascode transistor 325 in the sense path of the sense amplifier, as a partition between the original precharge and sense paths shown in FIG. 2. This tends to increase the resistance of the sense path relative to the precharge path.

A similar result may have been achieved in previous designs by simply increasing the length of the original cascode transistor 220, without incurring the cost of an additional cascode device. However, increasing the length of the original cascode transistor (without including an additional cascode transistor in the sense path) tends to significantly reduce the precharge voltage level on the sense line. In some cases, the precharge voltage level on the sense line may be reduced, such that a difference between the sense node voltage and the sense line voltage is greater than a turn-on voltage of the original cascode transistor. This may cause the sense node voltage to drop, even when the sense line voltage is intended to reflect a logic high value.

Sense amplifier 300 may include several circuit elements similar to those described above in FIG. 2. As such, similar reference numerals are used in FIG. 3 to reference the circuit elements, which are similar to those described above in FIG. 2. For example, reference numerals denoted by '2xx' in FIG. 2 may be replaced with numeral '3xx' in the embodiment of FIG. 3. Though sense amplifier 200 is described in the context of CMOS technology, substantially any other semiconductor process technology (e.g., any FET technology) may be used to fabricate sense amplifier 300, in alternative embodiments of the invention.

Similar to sense amplifier 200, sense amplifier 300 includes a precharge path and a sense path. As shown in FIG. 3, the precharge path includes a PMOS precharge transistor 310 coupled between a power supply node ($V_{CC}$) and the precharge node (P). Unlike sense amplifier 200, however, sense amplifier 300 includes separate sense paths. One of the sense paths includes a first NMOS cascode transistor 320 coupled between the precharge node and an input node (SL) of sense line 330. As noted above, sense line 330 may be a bit line for connecting to one or more memory cells in a memory array. It is understood, however, that sense line 330 may be alternatively configured for connecting to other devices, such as, e.g., one or more elements within a transceiver device.

Unlike sense amplifier 200, sense amplifier 300 includes a second NMOS cascode transistor 325, which is arranged within the other sense path for partitioning, or otherwise separating, the original precharge and sense paths shown in FIG. 2. As shown in FIG. 3, for example, second cascode transistor 325 is coupled between the sense node (i.e., input node ($I_1$) of first inverter 370) and the sense line 330. In addition, precharging of second cascode transistor 325 may be accomplished via a second precharge path, which extends between the power supply voltage ($V_{CC}$) and the first inverter input node ($I_1$) and includes a second PMOS precharge transistor 315. In this manner, the precharge node (P) may be substantially isolated from the sense node (S) by adding second cascode transistor 325 within sense amplifier 300. More specifically, cascode transistor 325 may be added for electrically isolating the precharge and sense nodes of sense amplifier 300. In doing so, sense amplifier 300 may demonstrate greater noise immunity, and thus, higher operating speeds and lower power consumption, than sense amplifier 200.

Sense amplifier 300 may also include an output path and, in some embodiments, a feedback path. As shown in FIG. 3, the output path is coupled in parallel to the second precharge path and may include all, or some, of the sense path through second cascode transistor 325. As such, the output path of sense amplifier 300 may extend between the sense line input node (SL) and the output node (OUT). As before, the output path generally includes a pair of inverters 370 and 390. In some cases, second inverter 390 may be coupled to the power supply node ($V_{CC}$) through PMOS transistor 380. If included, PMOS transistor 380 may be used to delay the rising edge of the OUT signal, thereby extending the hold time of the sense amplifier. As used herein, the "hold time" refers to the amount of time that valid data must be present at the input of a latch (or register) after a clocking signal closes the latch. Erroneous data may be stored within the latch if the valid data is not present for the duration of the hold time. In other cases, however, PMOS transistor 380 may be omitted from the circuit. For example, PMOS transistor 380 may not be needed for delaying the rising edge if a relatively large number of gates are arranged between the output of the sense amplifier and a latch receiving data from the sense amplifier.

The feedback path of sense amplifier 300 is generally coupled in parallel to the output path, extending between the power supply node ($V_{CC}$) and the first inverter input node ($I_1$). Similar to sense amplifier 200, the feedback path of sense amplifier 300 includes a pair of PMOS transistors 350 and 360. In some embodiments, the gate terminal of feedback transistor 360 may be coupled to the input node ($I_2$) of second inverter 390 for receiving a value output from first inverter 370. Feedback transistor 360 may generally function to maintain the sense node (S) at a relatively high voltage during times when sense line 330 is not discharged to ground. In other embodiments, however, a feedback connection between the input/output of the first inverter 370 may not be necessary, and the gate terminal of transistor 360 may be tied to ground similar to the gate terminal of transistor 350. For example, the feedback path may not be included in embodiments that wish to reduce the capacitance of input node ($I_2$) at the expense of higher power consumption.

In some cases, transistor 350 may be configured for controlling the amount of current flow through the feedback path (i.e., from the power supply node to the precharge and sense nodes), and therefore, may be considered a "leakage transistor." As such, transistor 350 may be sized to provide the appropriate amount of leakage without dissipating too much current. For example, a gate length of leakage transistor 350 may be formed substantially greater than a gate length of feedback transistor 360 to maintain the sense line node (SL) at a relatively high voltage when the sense line is not discharged. Due to the addition of second cascode transistor 325, sense amplifier 300 may include another PMOS transistor 355 in the feedback path for maintaining the precharge node (P) at a relatively high voltage when the sense line is not discharged. In some cases, PMOS transistor 355 may be controlled by the voltage at the gate terminal of transistor 360 and coupled between the drain terminal of transistor 350 and the precharge node (P).

In general, the operating sequence of sense amplifier 300 is similar to that of sense amplifier 200. For example, sense amplifier 300 may operate by: 1) precharging the sense line, then 2) shutting off precharge and allowing some other circuit (not shown) to pull down on the sense line (or not). If sense amplifier 300 were coupled to a memory array, the "other circuit" may be, for example, a memory cell within the memory array. It is understood, however, that other circuits may be coupled to the sense line depending on the application in which the sense amplifier is used.

A preferred operating sequence of sense amplifier 300 may now be described in reference to FIGS. 3 and 5. In graph 500 of FIG. 5, the voltages present at the sense line input node (SL), the precharge node (P), and the sense node (S) of sense amplifier 300 are tracked during the precharge and sensing states. During the precharge state, a LOW value may be supplied to the gate terminals (denoted BPCHG) of precharge transistors 310 and 315 to "precharge" sense amplifier 300. In other words, the voltage values of the precharge (P) and sense (S) nodes may be pulled up to values near the power supply node voltage ($V_{CC}$), while sense line 330 is precharged to a value approximately equal to the power supply node voltage ($V_{CC}$) minus a lesser of the turn-on voltage thresholds of cascode transistors 320 and 325.

Figure 5:
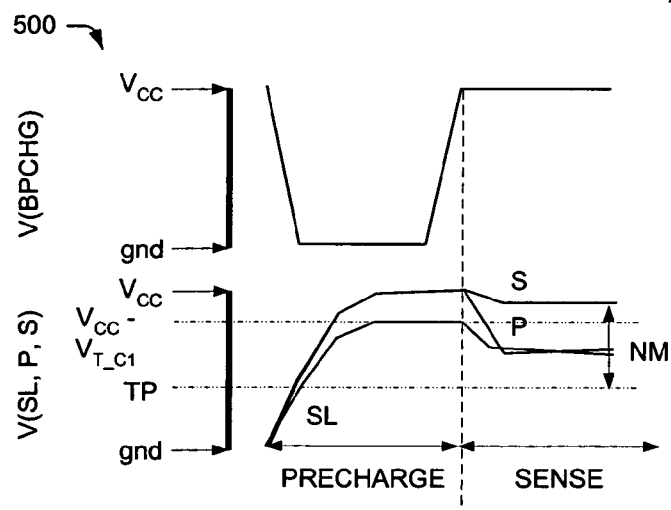
FIG. 5 is a graph of the sense line (SL), sense node (S) and precharge node (PC) voltages during precharge and sensing states of the sense amplifier of FIG. 3, when the threshold voltage of the cascode transistor within the sense path is greater than the threshold voltage of the cascode transistor within the precharge path.

In the preferred embodiment of FIG. 5, the turn-on voltage threshold ($V_{T\_C1}$) of transistor 320 is made smaller than the turn-on voltage threshold ($V_{T\_C2}$) of transistor 325, so as to precharge sense line 330 to a voltage value approximately equal to [$V_{CC}-V_{T\_C1}$]. This may be achieved, in some cases, by selecting a different dopant (and/or dopant concentration) for doping the channel regions of cascode transistor 320 and cascode transistor 325. In doing so, the noise margin (NM) of the sense amplifier may be increased by ensuring that the voltage ($V_{SL}$) at the sense line node (SL) is sufficiently elevated during the precharge state, so that during the sense state, the difference between the voltages [$V_{CC}-V_{SL}$] at the gate of transistor 325 and sense line node (SL) does not exceed the turn-on voltage of transistor 325. Since transistor 325 remains "off" during the sense state, the voltage present at the sense node will not be discharged, as shown in the embodiment of FIG. 4.

Figure 6:
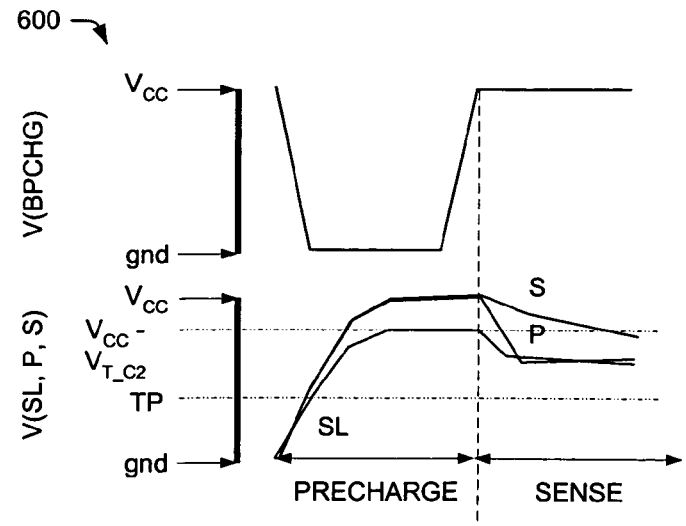
FIG. 6 is another graph of the sense line (SL), sense node (S) and precharge node (PC) voltages during precharge and sensing states of the sense amplifier of FIG. 3, when the sense path is substantially less conductive than the precharge path.

In other embodiments, the conductance of transistor 325 can be made smaller than the conductance of transistor 320, so as to precharge sense line 330 to a voltage value approximately equal to [$V_{CC}-V_{T\_C2}$]. This may be achieved, in some cases, by decreasing a width-to-length ratio ("W/L") of transistor 325 relative to transistor 320. As shown in FIG. 6, the noise margin of the sense amplifier may be increased (over the embodiment of FIG. 4) by decreasing the conductance of transistor 325; however, the initial increase in noise margin tends to decrease over time.

Once precharge is complete, a HIGH value may be supplied to the gate terminals of precharge transistors 310 and 315 to disable those transistors and initiate an evaluation of sense line 330 during a "sensing state" to detect a new voltage value at the sense node (S). If the voltage level on sense line 330 is HIGH, for example, the new voltage value may be substantially equal to the precharge voltage value on sense line 230 [$V_{CC}-(V_{T\_C1}$ XOR $V_{T\_C2})$], and a HIGH value may be output from the output node (OUT) of sense amplifier 300. Otherwise, the sense node (S) may be discharged to ground (via another circuit coupled to the sense line) in the case of a LOW value on sense line 330, thereby causing a LOW value to be output from sense amplifier 300.

Sense amplifier 300 improves upon conventional sense amplifiers by separating the original precharge and sense paths to substantially eliminate precharge path sensitivity to voltage perturbations (e.g., leakage currents) on the sense path during the "sensing state". As described above, the improvement may be accomplished by providing separate cascode transistors in the dual sense paths of the amplifier. In some embodiments, the separate cascode transistors may be independently sized, thereby allowing voltage threshold differences in transistor geometry and/or resistance to be adjusted for maintaining the sense node at VCC, or as high as possible, when a HIGH voltage value present on the sense line is perturbed.

For example, the W/L ratio of cascode transistor 320 can be increased to increase the conductance of the transistor, while increasing the noise margin of the sense amplifier. On the other hand, the W/L ratio of cascode transistor 325 can be manipulated to trade off between noise immunity and operational speed. For example, the W/L ratio of cascode transistor 325 can be decreased for decreasing the conductance of cascode transistor 325 and obtaining even greater noise immunity, or increased for maximizing the operational speed of the sense amplifier while maintaining acceptable noise margin.

In a preferred embodiment, however, relatively different turn-on voltages may be provided by independently adjusting the dopants (and/or dopant concentrations) applied to transistors 320 and 325. For example, a smaller dopant concentration may be applied to transistor 325 for increasing the turn-on voltage of transistor 325 relative to transistor 320. The difference in turn-on voltages may be provided in addition to, or instead of, the conductance modifications described above for obtaining an acceptable balance between noise immunity and operational speed. Other means for independently adjusting the turn-on voltages of transistors 320 and 325 may be possible and within the scope of the present invention.

The addition of cascode transistor 325 enables the sense amplifier trip-point to be set substantially higher, and thus, substantially faster than in conventional sense amplifiers while maintaining acceptable noise margins. However, the noise margin of sense amplifier 300 may be increased by giving up a little speed. Accordingly, the improvements described herein may be applicable to a broad range of technologies, and may be generally used to maximize the tradeoff between noise margin and the operating speed of sensing devices. For example, though sense amplifier 300 is described above in the context of a semiconductor memory device, sense amplifier 300 may be alternatively used for measuring the amount of voltage (or current) supplied by (or to) a component included within other types of electronic equipment.

It will be appreciated to those skilled in the art having the benefit of this disclosure that this invention is believed to provide dual cascode devices for precharge and sensing in a reduced swing, single-ended sense amplifier. Further modifications and alternative embodiments of various aspects of the invention will be apparent to those skilled in the art in view of this description. For example, one of ordinary skill in the art could understand how the NMOS circuit elements within the sense amplifier may be alternatively formed as PMOS, and vice versa. In addition, technologies other than CMOS may alternatively be used to form the circuit elements within the sense amplifier. It is intended, therefore, that the following claims be interpreted to embrace all such modifications and changes and, accordingly, the specification and drawings are to be regarded in an illustrative rather than a restrictive sense.

What is claimed is:

1. A sense amplifier, comprising:
a precharge node coupled to a power supply node through a first precharge transistor;
a sense node coupled to the power supply node through a second precharge transistor; and
a pair of cascode transistors coupled in parallel between the power supply node and a sense line, wherein one of the pair of cascode transistors is configured for separating the sense node from the precharge node.

2. The sense amplifier as recited in claim 1, further comprising an output path extending between the sense node and an output node of the sense amplifier, wherein the output path includes the sense node and a pair of inverters, but does not include the precharge node.

3. The sense amplifier as recited in claim 1, wherein the precharge node is arranged between the first precharge transistor and a first cascode transistor of the pair, and wherein the sense node is arranged between the second precharge transistor and a second cascode transistor of the pair, such that the sense node is electrically isolated from the precharge node.

4. The sense amplifier as recited in claim 3, wherein turn-on voltage thresholds of the first and second cascode transistors are determined independently from one another by applying an independently selected channel dopant to each of the cascode transistors.

5. The sense amplifier as recited in claim 4, wherein the first cascode transistor comprises a lower turn-on voltage threshold than the second cascode transistor.

6. The sense amplifier as recited in claim 3, wherein conductances of the first and second cascode transistors are determined independently from one another by forming each of the cascode transistors with an independently selected width-to-length ratio.

7. The sense amplifier as recited in claim 6, wherein the first cascode transistor comprises a higher conductance than the second cascode transistor.

8. A system comprising a sense amplifier, wherein the sense amplifier comprises:
a precharge node coupled to a power supply node through a first precharge transistor;
a sense node coupled to the power supply node through a second precharge transistor; and
a pair of cascode transistors coupled in parallel between the power supply node and a sense line for electrically isolating the senses node from the precharge node.

9. The system as recited in claim 8, wherein the sense amplifier further comprises an output path extending between the sense node and an output node of the sense amplifier, and wherein the output path includes the sense node and a pair of inverters, but does not include the precharge node.

10. The system as recited in claim 8, wherein the system further comprises an array of memory cells, and wherein the sense line is coupled for receiving a bitline voltage from one of the memory cells in the array.

11. The system as recited in claim 8, wherein the system further comprises a storage element, and wherein the sense line is coupled for receiving a voltage value corresponding to data to be stored within the storage element.

12. A method for increasing a noise margin of a sense amplifier comprising a pair of cascode transistors coupled in parallel between a power supply node and a sense line, wherein each of the pair of cascode transistors comprises a turn-on voltage threshold, and wherein the method comprises:
precharging the sense line up to a voltage value of the power supply node minus a lesser voltage of the turn-on voltage thresholds of the pair of transistors; and
wherein said precharging increases a noise margin of the sense amplifier by prohibiting at least one of the pair of cascode transistors to be activated during a sensing state of the sense amplifier.

13. The method as recited in claim 12, further comprising precharging a precharge node and a sense node to approximate a voltage value at the power supply node, wherein the precharge node is coupled between the power supply node and a first one of the pair of cascode transistors, and wherein the sense node is coupled between the power supply node and a second one of the pair of cascode transistors.

14. The method as recited in claim 13, wherein the lesser voltage corresponds to the turn-on voltage threshold of the first cascode transistor.

15. A method for increasing a noise margin of a sense amplifier, wherein the method comprises:
isolating a sense node of the sense amplifier from a precharge node of the sense amplifier by removing the precharge node from an output path of the sense amplifier; and
wherein said isolating increases the noise margin of the sense amplifier by eliminating a sensitivity of the sense node to voltage fluctuations present on the sense line during a sensing state.

16. The method as recited in claim 15, wherein said isolating comprises providing a pair of cascode transistors coupled in parallel between a power supply node and a sense line, wherein the precharge and sense nodes are respectively coupled to the sense line through a first cascode transistor and a second cascode transistor of the pair cascode transistors.

17. The method as recited in claim 16, wherein said providing comprises forming each of the first and second cascode transistors with an independently selected turn-on voltage threshold and conductance.

18. The method as recited in claim 17, wherein the first cascode transistor comprises a smaller turn-on voltage threshold than the second cascode transistor.

19. The method as recited in claim 18, wherein said providing comprises doping a channel region of the first cascode transistor with a higher dopant concentration than the second cascode transistor to provide the first cascode transistor with the smaller turn-on voltage.

20. The method as recited in claim 17, wherein the first cascode transistor comprises a higher conductance than the second cascode transistor.

21. The method as recited in claim 20, wherein said providing comprises forming the first cascode transistor with a greater width-to-length ratio than the second cascode transistor to provide the first cascode transistor with the higher conductance.

* * * * *